United States Patent
Zhong et al.

(10) Patent No.: US 11,870,219 B2
(45) Date of Patent: Jan. 9, 2024

(54) LASER DIODE AND METHOD FOR MANUFACTURING THE SAME

(71) Applicant: Xiamen Sanan Optoelectronics Technology Co., LTD, Xiamen (CN)

(72) Inventors: Zhibai Zhong, Xiamen (CN); Tao Ye, Xiamen (CN); Min Zhang, Xiamen (CN); Shao-Hua Huang, Xiamen (CN); Shuiqing Li, Xiamen (CN)

(73) Assignee: Quanzhou San'An Semiconductor Technology Co., Ltd., Nanan (CN)

( * ) Notice: Subject to any disclaimer, the term of this patent is extended or adjusted under 35 U.S.C. 154(b) by 278 days.

(21) Appl. No.: 17/227,534

(22) Filed: Apr. 12, 2021

(65) Prior Publication Data
US 2021/0384702 A1 Dec. 9, 2021

(30) Foreign Application Priority Data
Jun. 9, 2020 (CN) .......................... 202010518817.3

(51) Int. Cl.
*H01S 5/22* (2006.01)
*H01S 5/042* (2006.01)
*H01S 5/32* (2006.01)
*H01S 5/16* (2006.01)

(52) U.S. Cl.
CPC .......... *H01S 5/222* (2013.01); *H01S 5/04256* (2019.08); *H01S 5/3211* (2013.01); *H01S 5/168* (2013.01)

(58) Field of Classification Search
CPC .................................................. H01S 5/222
See application file for complete search history.

(56) References Cited

U.S. PATENT DOCUMENTS

2011/0235666 A1* 9/2011 Sonobe ............... H01S 5/22 257/E33.012
2020/0335946 A1* 10/2020 Shigihara ............ H01S 5/0653

FOREIGN PATENT DOCUMENTS

WO WO-2021056617 A1 * 4/2021 ........... H01S 5/0604

OTHER PUBLICATIONS https://refractiveindex.info/?shelf=main&book=GaAs&page=Ozaki (Year: 2023).*
https://refractiveindex.info/?shelf=main&book=SiO2&page=Malitson (Year: 2023).*

* cited by examiner

*Primary Examiner* — Tod T Van Roy
*Assistant Examiner* — Stephen Sutton Kotter
(74) *Attorney, Agent, or Firm* — Thomas | Horstemeyer, LLP

(57) ABSTRACT

A laser diode includes a substrate, an epitaxial structure, an electrode contacting layer and an optical cladding layer. The epitaxial structure is disposed on the substrate, and is formed with a ridge structure opposite to the substrate. The electrode contacting layer is disposed on a top surface of the ridge structure. The optical cladding layer has a refractive index smaller than that of the electrode contacting layer The optical cladding layer includes a first cladding portion which covers side walls of the ridge structure, and a second cladding portion which is disposed on a portion of the top surface of the ridge structure. A method for manufacturing the abovementioned laser diode is also disclosed.

23 Claims, 9 Drawing Sheets

LASER DIODE AND METHOD FOR MANUFACTURING THE SAME

CROSS-REFERENCE TO RELATED APPLICATION

This application claims priority of Chinese Invention Patent Application No. 20201051817.3, filed on Jun. 9, 2020.

FIELD

The disclosure relates to a semiconductor device and a manufacturing method thereof, and more particularly to a laser diode, and a manufacturing method thereof.

BACKGROUND

Semiconductor light-emitting devices such as light-emitting diodes (LED) and laser diodes, have superior light-emitting property, and therefore, have gained attention from researchers for their commercial applications For example, a gallium nitride (GaN) -based laser diode is one of the semiconductor light-emitting devices which has been widely researched and marketed, especially in terms of laser display and laser projection.

One common structure of the GaN-based laser diode is an edge emitting ridge waveguide structure Referring to FIG. 1, a conventional laser diode includes an n-type electrode 1, a substrate 2, a laser epitaxial structure 3 and a p-type electrode 4. The laser epitaxial structure 3 includes an n-type semiconductor layer, an active layer, a p-type semiconductor layer which are sequentially disposed on the substrate 2 in such order. The n-type semiconductor layer is electrically connected to the n-type electrode 1. The p-type semiconductor layer is formed with a ridge structure 31 by inductively coupled plasma (ICP) etching. A metal layer 32 1s disposed on the ridge structure 31, and is electrically connected to the p-type electrode 4. The laser epitaxial structure further includes an optical cladding layer 33 disposed on side walls of the ridge structure 31.

However, the cladding layer 33 has a problem of poor adhesion with the p-type semiconductor layer made of a Gray-based material. As such, the cladding layer 33 is liable to peeling or damage, resulting in a high risk of electrical leakage of the laser diode. In addition, the damaged cladding layer 33 might not be able to provide a sufficient limitation to light field, thereby adversely affecting the performance of the laser diode. Moreover, the metal layer 32 entirely covers a top surface of the ridge structure 31 without considering the light field, which is not conducive to achieve a balanced distribution of the light field.

SUMMARY

Therefore, an object of the disclosure is to provide a laser diode and a method for manufacturing the same that can alleviate at least one of the drawbacks of the prior art.

According to this disclosure, the laser diode includes a substrate, an epitaxial structure, an electrode contacting layer and an optical cladding layer. The substrate has a first surface and a second surface that are opposite to each other. The epitaxial structure is disposed on the first surface of the substrate, and is formed with a ridge structure on a side of the epitaxial structure opposite to the substrate. The electrode contacting layer is disposed on a top surface of the ridge structure. The optical cladding layer has a refractive index smaller than that of the electrode contacting layer. The optical cladding layer includes a first cladding portion which covers side walls of the ridge structure, and a second cladding portion which is disposed on a portion of the top surface of the ridge structure.

According to this disclosure, the method for manufacturing the laser diode includes the steps of:

(a) providing a substrate which has a first surface and a second surface that are opposite to each other;

(b) forming an epitaxial structure on the first surface of the substrate;

(c) etching the epitaxial structure to form a ridge structure on a side of the epitaxial structure opposite to the substrate;

(d) forming an electrode contacting layer on the ridge structure; and (e) forming an optical cladding layer on a top surface of the ridge structure.

The optical cladding layer formed in step (e) includes a first cladding portion covering side walls of the ridge structure, and a second cladding portion disposed on a portion of the top surface of the ridge structure.

BRIEF DESCRIPTION OF THE DRAWINGS

Other features and advantages of the disclosure will become apparent in the following detailed description of the embodiment(s) with reference to the accompanying drawings, of which.

DETAILED DESCRIPTION

Figure 1:
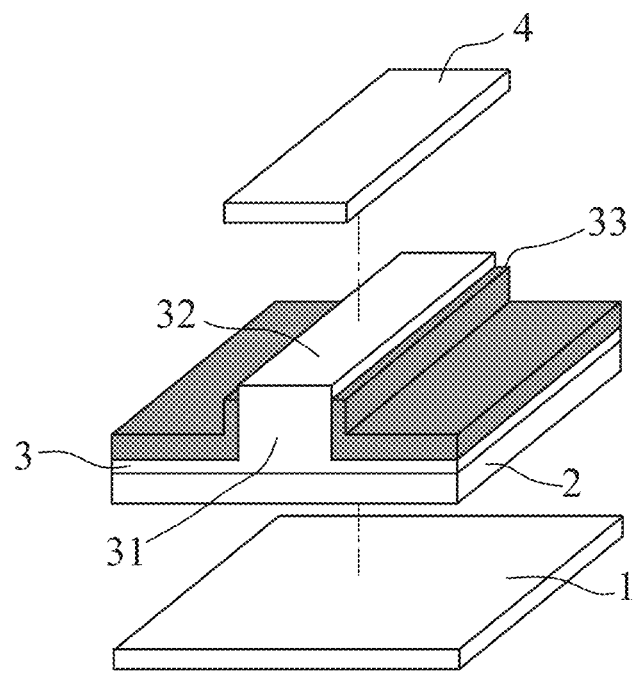
FIG. 1 is a schematic view illustrating a conventional laser diode.

Before the disclosure is described n greater detail, it should be noted that where considered appropriate, reference numerals or terminal port ions of reference numerals have been repeated among the figures to indicate corresponding or analogous elements, which may optionally have similar characteristics.

Figure 2:
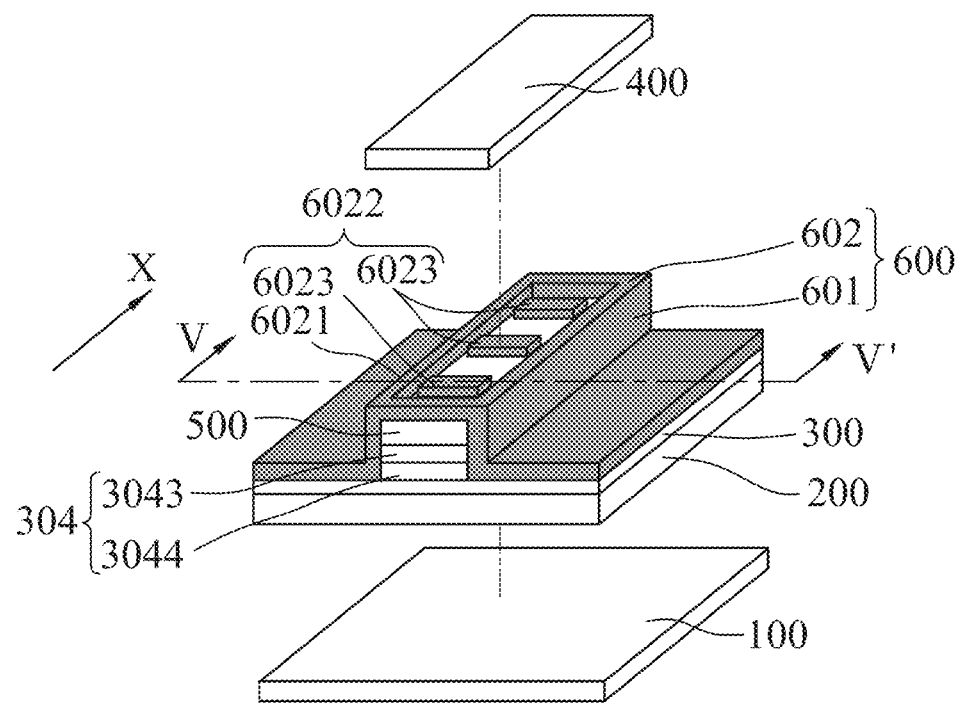
FIG. 2 is a schematic view illustrating a first embodiment of a laser diode according to the disclosure.
Figure 6A:
FIGS. 6A to 6G are schematic views illustrating consecutive steps of a first embodiment of a method for manufacturing the first embodiment of the laser diode according to the disclosure.
Figure 6B:
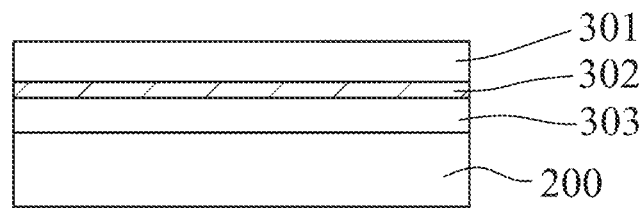
Figure 6C:
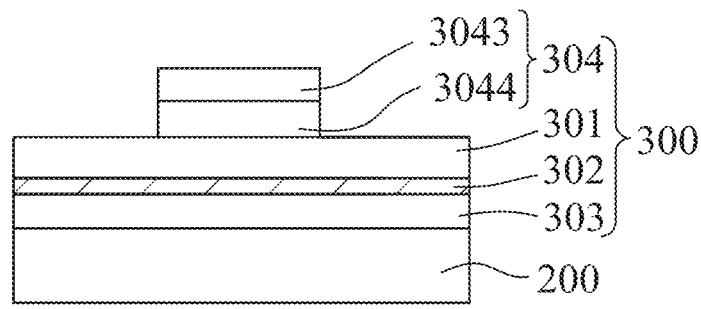
Figure 6D:
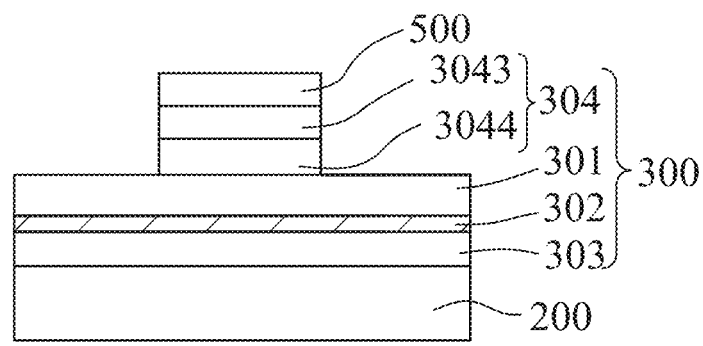
Figure 6E:
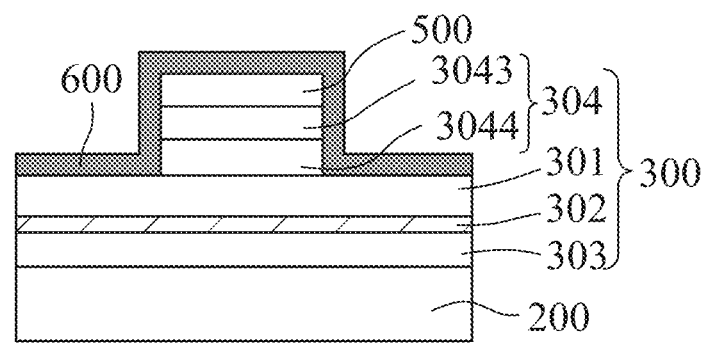
Figure 6F:
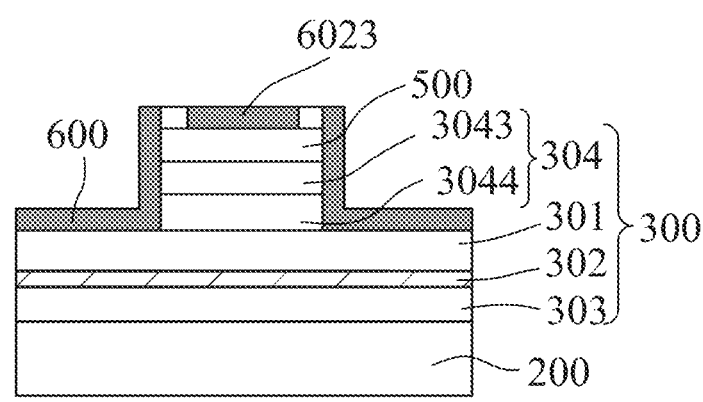
Figure 6G:
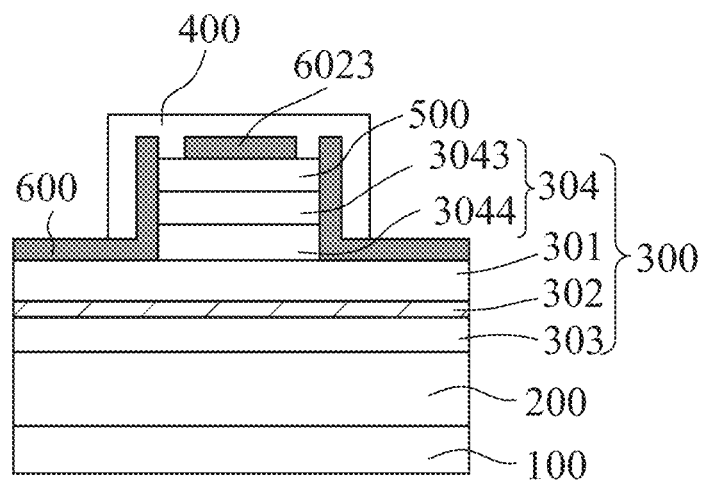

Referring to FIGS. 2 and 6G, a first embodiment of a laser diode includes a substrate 200, an epitaxial structure 300, an electrode contacting layer 500 and an optical cladding layer 600.

The substrate 200 has a first surface and a second surface that are opposite to each other. Examples of a material for making the substrate 200 may include, but are not limited. to, sapphire, silicon carbide, and gallium nitride.

The epitaxial structure 300 is disposed on the first surface of the substrate 200. The epitaxial structure 300 includes a first semiconductor layer 303, an active layer 302 and a second semiconductor layer 301 that are sequentially disposed on the first surface of the substrate 200 in such order. In this embodiment, the first semiconductor layer 303 is an n-type semiconductor layer, and the second semiconductor layer 301 is a p-type semiconductor layer.

In addition, the epitaxial structure 300 is formed with a ridge structure 304 on a side of the epitaxial structure 300 opposite to the substrate 200. In this embodiment, the epitaxial structure 300 further includes a covering layer 3044 and a p-type wave-guide layer 3043 sequentially disposed on the second semiconductor layer 301 to form the ridge structure 304 (see FIG. 4). The ridge structure 304 extends in a direction (X) which serves as a laser propagation direction (i.e., a waveguide path of the laser diode). That is, the ridge structure 304 serves as a waveguide.

The electrode contacting layer 500 is disposed on a top surface of the ridge structure 304 opposite to the substrate 200, so as to spread current laterally and increase current spreading area. The electrode contacting layer 500 may be made of a material having desired properties, such as a good electrical conductivity, a high transmittance of light and/or a low manufacturing cost. Examples of the material for making the electrode contacting layer 500 may include, but are not limited to, indium, tin oxide and zinc; oxide The optical cladding layer 600 includes a first cladding portion 601 and a second cladding portion 602. The first cladding portion 601 covers side walls of the ridge structure 304, and the second cladding portion 602 is disposed on a portion of the top surface of the ridge structure 304. In this embodiment, the first cladding portion 601 further covers side walls of the electrode contacting layer 500. The firs cladding portion 601 may also cover a surface of the epitaxial structure 300 opposite to the substrate 200. The second cladding portion 602 may include an edge section 6021 which is connected to the first cladding portion 601, and a middle section 6022 which is spaced apart from and surrounded by the edge section 6021.

Figure 4:
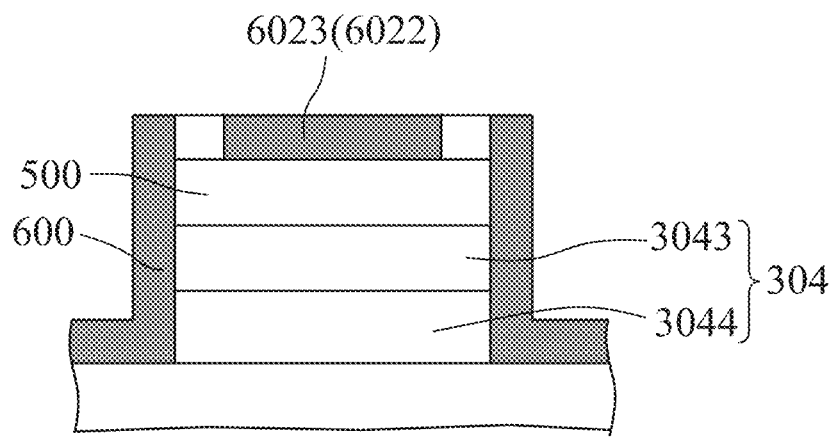
FIG. 4 is an enlarged sectional view taken along line V-V' shown in FIG. 2 illustrating a part of the first embodiment of the laser diode according to the disclosure.

Referring further to FIG. 4, The edge section 6021 cooperates with the first cladding portion 601 to form a continuous structure covering the side walls of the ridge structure 304, such that the optical cladding layer 600 is less susceptible to peeling or damage, thereby greatly reducing risk of electrical leakage of the laser diode.

Figure 3A:
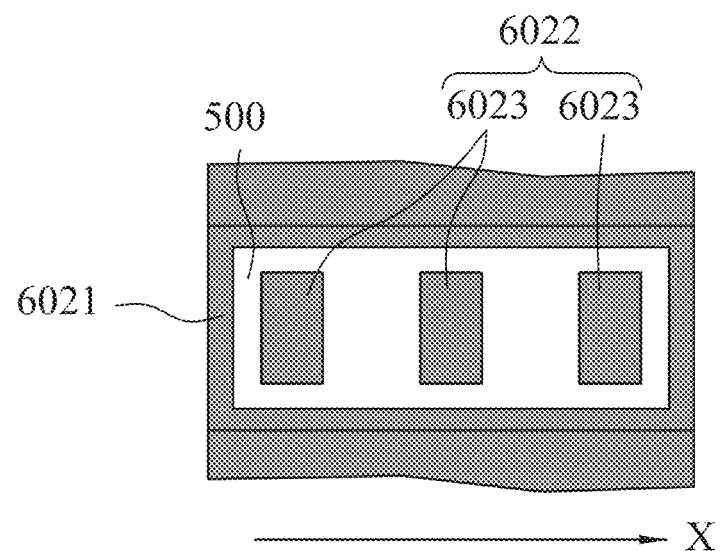
FIGS. 3A and 3B are top views illustrating configurations of island structures of the first embodiment and a variation thereof, respectively.
Figure 3B:
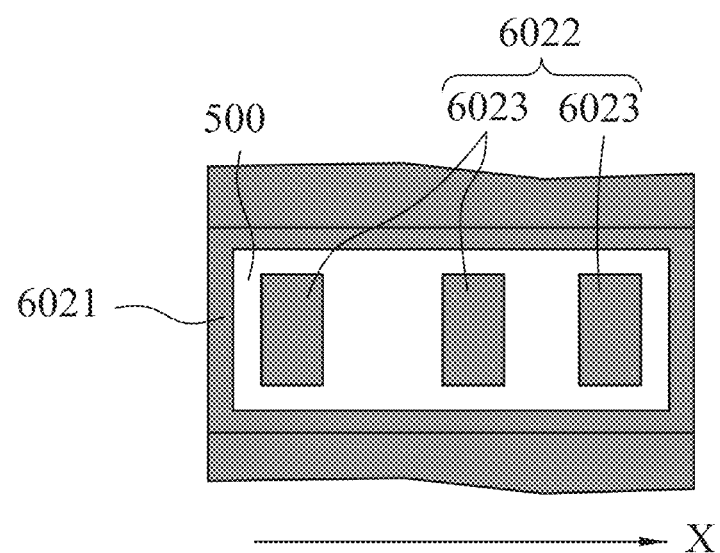

The middle section 6022 may be configured as a plurality of island structures 6023 that are spaced apart from each other. In this embodiment, the island structures 6023 are disposed on the electrode contacting layer 500, and are equally spaced apart from one another (see FIG. 3A). In a variation of the first embodiment, two immediately adjacent ones of the island structures 6023 are spaced apart by a distance that decreases along a direction from a light exit side toward a light reflective side of the laser diode, i.e., the direction X (see FIG. 3B). That is, the arranging density of the island structures 6023 increases along the direction X. Such configuration is capable of enhancing current diffusion and balancing light field distribution, and is also advantageous to control the gain in optical efficiency, so as to improve light output effect of the laser diode. In addition, the presence of island structures 6023 increases an insulating area of a light exit surface of the laser diode, reduces gain of the light near the edge section 6021, thereby increasing service life of the laser diode.

A projection of the second cladding portion 602 on the ridge structure 304 may account for not lower than 10%, such as 20% to 80%, of an area of the top surface of the ridge structure 304. Depending on the area of the top surface of the ridge structure 304, an area of the projection of the second cladding portion 602 on the ridge structure 304 may be varied. For example, when the top surface of the ridge structure 304 has a dimension (length×width) of 1200 μm×45 μm, the projection of the second cladding portion 602 on the ridge structure 304 may account for 50% to 80% of the area of the top surface of the ridge structure 304. When the dimension of the top surface of the ridge structure is 1200 μm×30 μm, the projection of the second cladding portion 602 on the ridge structure 304 may account for 40% to 60% of the area of the top surface of the ridge structure 304. When the dimension of the top surface of the ridge structure is 1200 μm×15 μm, the projection of the second cladding portion 602 on the ridge structure 304 may account for 30% to 50% of the area of the top surface of the ridge structure 304. When the dimension of the top surface of the ridge structure is 800 μm×15 μm, the projection of the second cladding portion 602 on the ridge structure 304 may account for 20% to 40% of the area of the top surface of the ridge structure 304. It should be noted that the area percentage of the projection of the second cladding portion 602 on the top surface of the ridge structure 304 is not limited to those described herein.

The optical cladding layer 600 has a refractive index smaller than that of the electrode contacting layer 500. The refractive index of the electrode contacting layer 500 may be smaller than that of the epitaxial structure 300. With the refractive indices of the epitaxial structure 300, the electrode contacting layer 500 and the optical cladding layer 600 sequentially increasing in such order, a better confinement of the light field within the ridge structure 304 may be achieved, so as to obtain an improved light output efficiency. In certain embodiments, a difference between the refractive index of the optical cladding layer 600 and that of the second electrode contacting layer 500 is not less than 0.2, such as not less than 0.3. The refractive index of the optical cladding layer 600 may range from 1.3 to 1.9, such as 1.3 to 1.5, or 1.5 to 1.7. The optical cladding layer 600 may be made of a material having a relatively high dense insulating property and a relatively low refractive index to achieve an improved total light reflection. Examples of the material for making the optical cladding layer 600 may include, but are not ted to, $SiO_2$, $Al_2O_3$, MgF, CaF, MgO, AlN, SiNO, and combinations thereof. For instance, when the optical cladding layer 600 is made of $SiO_2$, the electrode contacting layer 500 may be made of ITO. In addition, in such case, the covering layer 3044 and p-type waveguide layer 3043 of the ridge structure 304 may be made of p-GaN (with a refractive index of 2.4), and the substrate 200 may be made of GaN (with a refractive index of 2.4), so that the light field may be further confined, and the light output efficiency of the laser diode may be further improved.

The optical cladding layer 600 and the electrode contacting layer 500 may have a total thickness that is an odd multiple of $\lambda/4n$, in which $\lambda$ is a wavelength of a light emitted by the laser diode, and n which is an equivalent refractive index of the optical cladding layer 600 and the electrode contacting layer 500, and which is an integer not smaller than 1.

The laser diode may further include a first electrode 100 and a second electrode 400. The first electrode 100 is electrically connected to the epitaxial structure 300. The second electrode 400 is formed on the optical cladding layer 600, and is electrically connected to the electrode contacting layer 500. The second cladding portion 602 of the optical cladding layer 600 is disposed between the electrode contacting layer 500 and the second electrode 400, and a portion of the electrode contacting layer 500 is exposed from the second cladding portion 602.

Figure 5:
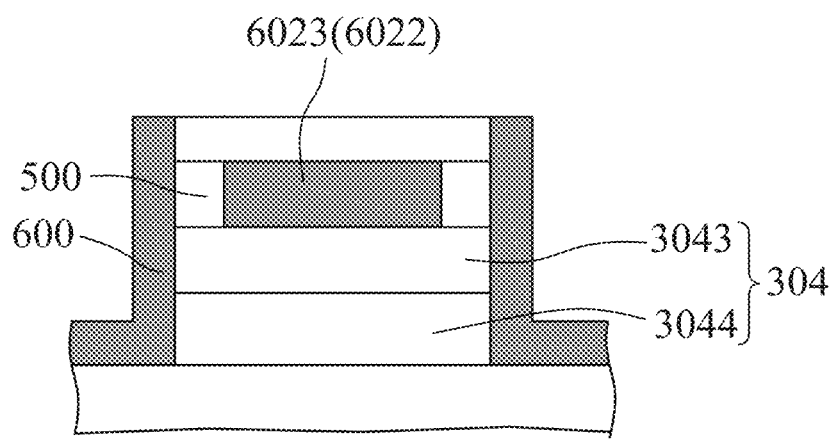
FIG. 5 is an enlarged sectional view illustrating a part of a second embodiment of the laser diode according to the disclosure.
Figure 7A:
FIGS. 7A to 7H are schematic views illustrating consecutive steps of a second embodiment of the method for manufacturing the second embodiment of the laser diode according to the disclosure.
Figure 7B:
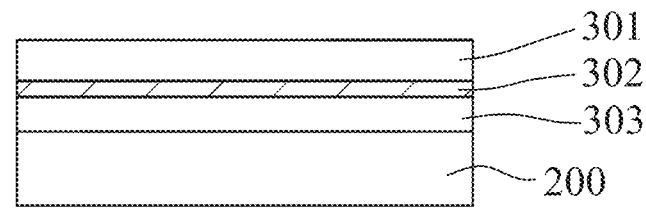
Figure 7C:
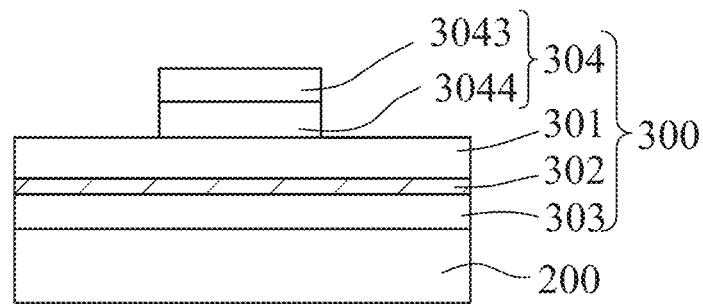
Figure 7D:
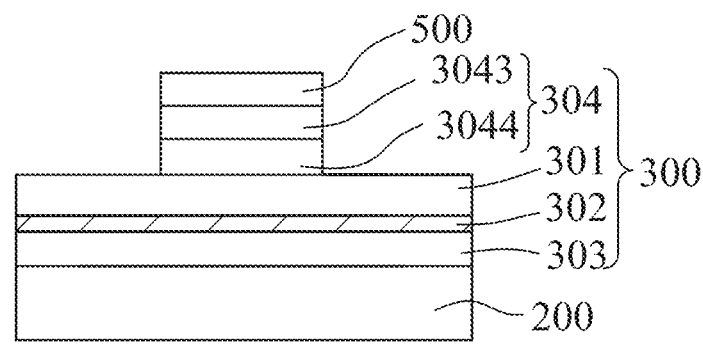
Figure 7E:
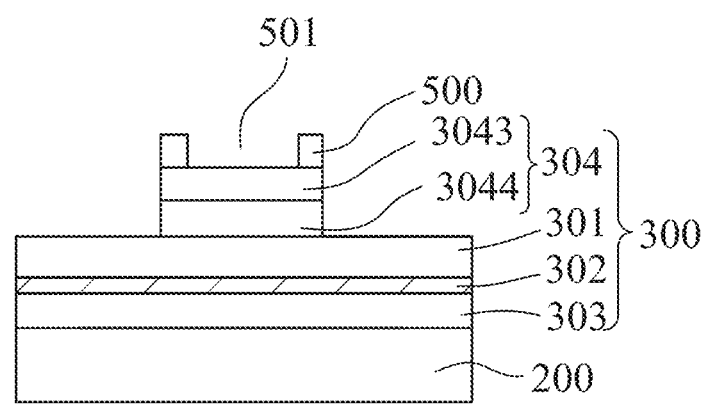
Figure 7F:
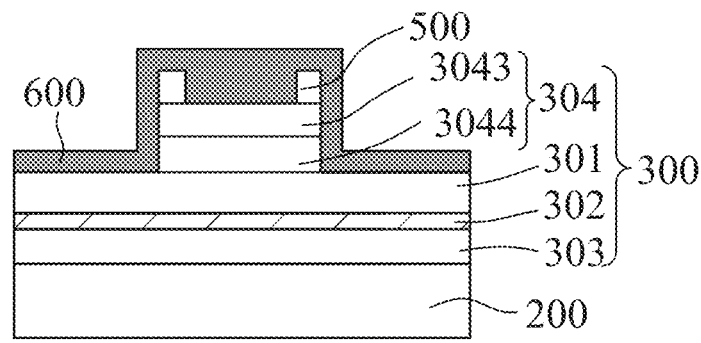
Figure 7G:
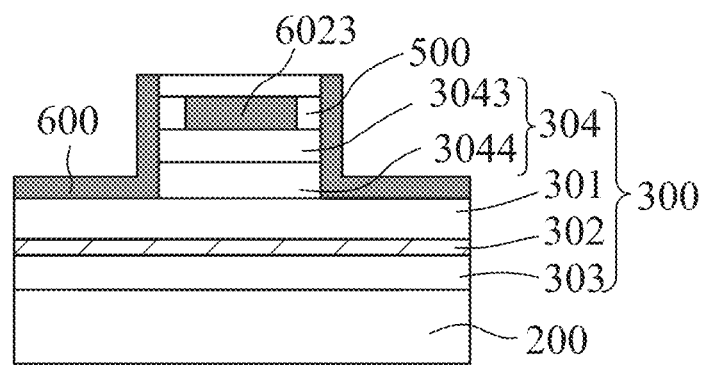
Figure 7H:
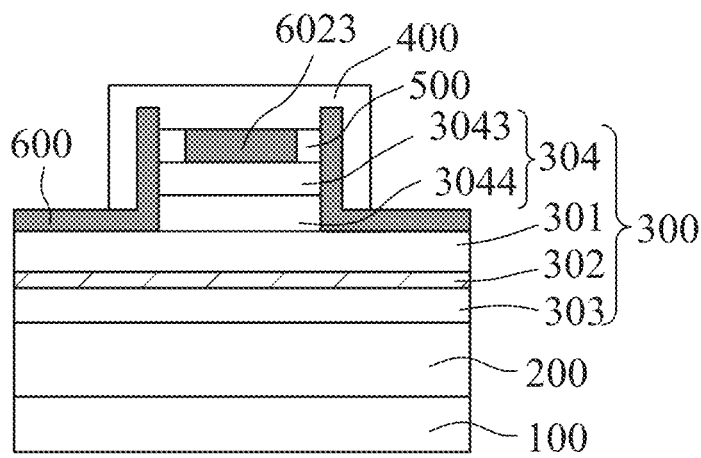

Referring to FIGS. 5 and 7H, a second embodiment of laser diode according to this disclosure is generally similar to the first embodiment, except that the electrode contacting layer 500 is formed with a plurality of through holes 501 to expose the top surface of the ridge structure 304, and the island structures 6023 are filled in the through holes 501 That is, the island structures 6023 are embedded in the electrode contacting layer 500.

Referring to FIGS. 6A to 6G, a first embodiment of a method for manufacturing the first embodiment of the laser diode according to this disclosure includes the following steps.

In step (a), referring to FIG. 6P, the substrate 200 is provided.

In step (b), referring to FIG. 6B, the epitaxial structure 300 is formed on the first surface of the substrate 200 by, e.g., metal organic chemical vapor phase deposition (MOCVD). Specifically, the first semiconductor layer 303, the active layer 302 and the second semiconductor layer 301 are sequentially formed on the first surface of the substrate 200 in such order.

In step (c) referring to FIG. 6C, the epitaxial structure 300 is etched to form a ridge structure 304 on a side of the epitaxial structure 300 opposite to the substrate 200. Specifically, a photolithographic mask (not shown in the figures) is first applied on the second semiconductor layer 301 to form an opening (i.e., a photolithographic window), and then a portion of the second semiconductor layer 301 exposed from the opening subjected to a dry-etching process, e.g., ICP etching, to form the ridge structure 304. In certain embodiments, when the covering layer 3044 and the p-type waveguide layer 3043 are further sequentially formed on the second semiconductor layer 301, the etching is terminated at the second semiconductor layer 301, so as to obtain the ridge structure 304 as shown in FIG. 4 or FIG. 5.

In step (d), referring to FIG. 6D, the electrode contacting layer 500 is formed on the ridge structure 304 by, e.g., a sputtering deposition process.

In step (e) referring to FIGS. 6S and 6S, the optical cladding layer 600 is formed on the side walls and the top surface of the ridge structure 304. The first cladding portion 601 covers the side walls of the ridge structure 304 and the electrode contacting layer 500, and the second cladding portion 602 is disposed on a portion of the top surface of the ridge structure 304.

Specifically, the optical cladding layer 600 is first disposed over the ridge structure 304, and then is subjected to a patterning process (e.g., using a mask) to form the first cladding portion 601 and the second cladding portion 602. The second cladding portion 602 is formed with the edge section 6021 which is connected to the first cladding portion 601, and the middle section 6022 which is spaced apart from and surrounded by the edge section 6021. The middle section 6022 is formed as a plurality of the island structures 6023 that are spaced apart from each other, and that are disposed on the electrode contacting layer 500.

It should be noted that the mask used in the patterning process may be removed after the optical cladding layer 600 is formed. Alternatively, when the mask is made of a metallic material, the mask may remain on the ridge structure 304 and may serve as a part of the second electrode 400 formed in the following step.

In step (f), referring to FIG. 6G. The first electrode 100 is formed on the substrate 200 opposite to the epitaxial structure 300. The second electrode 400 is formed on the optical cladding layer 600 opposite to the epitaxial structure 300, and is electrically connected to the electrode contacting layer 500. As such, the first embodiment of the laser diode according to the disclosure is prepared.

Referring to FIGS. 7A to 7H, a second embodiment of the method for manufacturing the second embodiment of the laser diode according to this disclosure is generally similar to the aforementioned first embodiment of the method, in which the steps shown in FIGS. 6A to 6D and G are identical to those shown in FIGS. 7A to 7D and 7H, except that step (e) further includes the following substeps.

In substep (e1), referring to FIG. 7E, the electrode contacting layer 500 is patterned to form a plurality of the through holes 501 to partially expose the top surface of the ridge structure 304.

In substep (e2), referring to FIG. 7F, the optical cladding layer 600 is formed to cover the electrode contacting layer 500 and the side walls of the ridge structure 304, and also to fill the through holes 501.

In substep (e3), referring to FIG. 7G, the optical cladding layer 600 is patterned to form the first cladding portion 601 and the second cladding portion 602. The second cladding portion 602 includes the edge section 6021 which is connected to the first cladding portion 601, and the middle section 6022 which is spaced apart from and surrounded by the edge section 6021. The middle section 6022 fills the through holes 501, and forms the island structures 6023.

Figure 8:
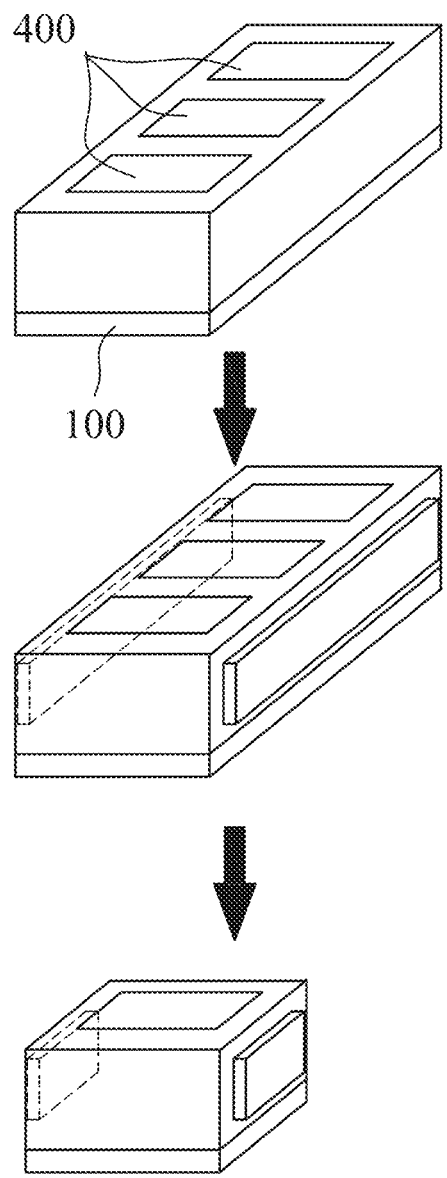
FIG. 8 is a series of schematic views illustrating consecutive steps for manufacturing a laser diode die from the laser diode of the disclosure.

Referring to FIG. 8, the laser diode of the disclosure including a plurality of the second electrodes 400 respectively formed on a plurality of the ridge structure 304 (i.e., in a form of laser diode bar) may be used to prepare a plurality of laser diode dies according to the following steps. First, the laser diode bar is coated with a reflective film and an anti-reflective film respectively on two opposite surfaces thereof along the extension direction of the ridge structure 304 (i.e., the direction X shown in FIG. 2), so as to form a coated bar having a Fabry-Perot (F-P) cavity The coated bar is then cut along the extension direction of the ridge structure 304 through, e.g., a dry-etching process or a scribing and breaking process using a dicing saw, so as to form the laser diode dies that are separated from each other. Each of the resultant laser diode dies may be further packaged, so as to obtain a packaged laser diode device.

In conclusion, with the first cladding portion 601 covering the side walls of the ridge structure 304 and the second cladding portion 602 covering a portion of the top surface of the ridge structure 304. The ridge structure 304 can be conferred with an improved protection, so that electrical leakage of the laser diode this of disclosure can be avoided. In addition, by virtue of forming the island structures 6023 spaced apart from and surrounded by the edge section 6021 on the top surface of the ridge structure 304, the ridge structure 304 can exhibit an improved current diffusion ability and a balanced distribution of light field of the laser diode of this disclosure, so as to improve light output efficiency thereof.

In the description above, for the purposes of explanation, numerous specific details have been set forth in order to provide a thorough understanding of the embodiments. It will be apparent, however, to one skilled in the art, that one or more other embodiments may be practiced without some of these specific details. It should also be appreciated that reference throughout this specification to "one embodiment," "an embodiment," an embodiment with an indication of an ordinal number and so forth means that a particular feature, structure, or characteristic may be included in the practice of the disclosure. It should be further appreciated that in the description, various features are sometimes grouped together in a single embodiment, figure, description thereof for the purpose of streamlining the disclosure and aiding in the understanding of various inventive aspects, and that one or more features or specific details from one embodiment may be practiced together with one or more features or specific details from another embodiment, where appropriate, in the practice of the disclosure.

While the disclosure has been described in connection with what are considered the exemplary embodiments, it is understood that this disclosure is not limited to the disclosed embodiments but is intended to cover various arrangements included within the spirit and scope of the broadest interpretation so as to encompass all such modifications and equivalent arrangements.

What is claimed is:

1. A laser diode, comprising:
    a substrate having a first surface and a second surface that are opposite to each other;
    an epitaxial structure that is disposed on said first surface of said substrate and that is formed with a ridge structure on a side of said epitaxial structure opposite to said substrate;
    an electrode contacting layer disposed on a top surface of said ridge structure; and
    an optical cladding layer having a refractive index smaller than that of said electrode contacting layer, and including a first cladding portion which covers side walls of said ridge structure, and a second cladding portion which is disposed on a portion of said top surface of said ridge structure,
    wherein said optical cladding layer and said electrode contacting layer have a total thickness that is an odd multiple of $\lambda/4n$, in which $\lambda$ is a wavelength of a light emitted by said laser diode, and n is an integer not smaller than 1.

2. The laser diode of claim 1, further including a first electrode that is electrically connected to said epitaxial structure, and a second electrode that is formed on said optical cladding layer and that is electrically connected to said electrode contacting layer.

3. The laser diode of claim 2, wherein said second cladding portion of said optical cladding layer is disposed between said electrode contacting layer and said second electrode, and a portion of said electrode contacting layer is exposed from said second cladding portion.

4. The laser diode of claim 1, wherein said first cladding portion further covers side walls of said electrode contacting layer, and said second cladding portion includes an edge section which is connected to said first cladding portion, and a middle section which is spaced apart from and surrounded by said edge section.

5. The laser diode of claim 4, wherein said middle section is configured as a plurality of island structures that are spaced apart from each other.

6. The laser diode of claim 5, wherein two immediately adjacent ones of said island structures are spaced apart by a distance that decreases along a direction from a light exit side toward a light reflective side of the laser diode.

7. The laser diode of claim 5, wherein said electrode contacting layer is formed with a plurality of through holes to expose said top surface of said ridge structure, and said island structures are filled in said through holes.

8. The laser diode of claim 5, wherein said island structures are disposed on said electrode contacting layer.

9. The laser diode of claim 1, wherein a projection of said second cladding portion on said ridge structure accounts for not lower than 10% of an area of said top surface of said ridge structure.

10. The laser diode of claim 9, wherein the projection of said second cladding portion on said ridge structure accounts for 20% to 80% of said area of said top surface of said ridge structure.

11. The laser diode of claim 1, wherein the refractive index of said optical cladding layer ranges from 1.3 to 1.9.

12. The laser diode of claim 1, wherein a difference between the refractive index of said optical cladding layer and that of said electrode contacting layer is not less than 0.2.

13. The laser diode of claim 1, wherein the refractive index of said electrode contacting layer is smaller than that of said epitaxial structure.

14. The laser diode of claim 1, wherein said optical cladding layer is made of a material selected from the group consisting of $SiO_2$, $Al_2O_3$, MgF, CaF, MgO, AlN, SiNO, and combinations thereof.

15. A laser diode, comprising:
    a substrate having a first surface and a second surface that are opposite to each other;
    an epitaxial structure that is disposed on said first surface of said substrate and that is formed with a ridge structure on a side of said epitaxial structure opposite to said substrate;
    an electrode contacting layer disposed on a top surface of said ridge structure, and formed with a plurality of through holes to expose said top surface of said ridge structure; and
    an optical cladding layer having a refractive index smaller than that of said electrode contacting layer, and including a first cladding portion which covers side walls of said ridge structure and side walls of said electrode contacting layer, and a second cladding portion which is disposed on a portion of said top surface of said ridge structure and which includes an edge section connected to said first cladding portion and a middle section spaced apart from and surrounded by said edge section, said middle section being configured as a plurality of island structures that are spaced apart from each other and that are filled in said through holes.

16. The laser diode of claim 15, further including a first electrode that is electrically connected to said epitaxial structure, and a second electrode that is formed on said optical cladding layer and that is electrically connected to said electrode contacting layer.

17. The laser diode of claim 15, wherein two immediately adjacent ones of said island structures are spaced apart by a distance that decreases along a direction from a light exit side toward a light reflective side of the laser diode.

18. The laser diode of claim 15, wherein a projection of said second cladding portion on said ridge structure accounts for not lower than 10% of an area of said top surface of said ridge structure.

19. The laser diode of claim 18, wherein the projection of said second cladding portion on said ridge structure accounts for 20% to 80% of said area of said top surface of said ridge structure.

20. The laser diode of claim 15, wherein the refractive index of said optical cladding layer ranges from 1.3 to 1.9.

21. The laser diode of claim 15, wherein a difference between the refractive index of said optical cladding layer and that of said electrode contacting layer is not less than 0.2.

22. The laser diode of claim 15, wherein the refractive index of said electrode contacting layer is smaller than that of said epitaxial structure.

23. The laser diode of claim 15, wherein said optical cladding layer is made of a material selected from the group consisting of $SiO_2$, $Al_2O_3$, MgF, CaF, MgO, AlN, SiNO, and combinations thereof.

* * * * *